US012770844B2

(12) United States Patent
Choi et al.

(10) Patent No.: US 12,770,844 B2
(45) Date of Patent: Oct. 20, 2026

(54) PLASMA DIAGNOSIS DEVICE AND MANUFACTURING METHOD OF PLASMA DIAGNOSIS DEVICE

(71) Applicant: Samsung Electronics Co., Ltd., Suwon-si (KR)

(72) Inventors: Youn Sok Choi, Suwon-si (KR); Ju Hyun Kim, Suwon-si (KR); Hae Wook Park, Suwon-si (KR); Young Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 126 days.

(21) Appl. No.: 18/657,015

(22) Filed: May 7, 2024

(65) Prior Publication Data

US 2025/0046588 A1 Feb. 6, 2025

(30) Foreign Application Priority Data

Aug. 3, 2023 (KR) ........................ 10-2023-0101373

(51) Int. Cl.
*H01J 37/32* (2006.01)

(52) U.S. Cl.
CPC ................... *H01J 37/32917* (2013.01); *H01J 2237/24564* (2013.01)

(58) Field of Classification Search
CPC .................. H01J 37/32917; H01J 2237/24564
See application file for complete search history.

(56) References Cited

U.S. PATENT DOCUMENTS 6,952,108 B2 * 10/2005 Blalock .............. G01R 31/2831 29/846
7,129,724 B2 10/2006 Blalock
7,135,852 B2 * 11/2006 Renken ............... H10P 72/0604 438/5
7,149,643 B2 12/2006 Renken et al.
7,482,576 B2 1/2009 Mundt et al.
(Continued)

FOREIGN PATENT DOCUMENTS

KR 102026733 B1 9/2019
KR 20210117828 A 9/2021

OTHER PUBLICATIONS

Kim et al. "Wireless wafer-type probe system for measurement of two-dimensional plasma parameters and spatial uniformity" Meas. Sci. Technol. 24(9) (2013).

*Primary Examiner* — Reena Aurora
(74) *Attorney, Agent, or Firm* — Wolf, Greenfield & Sacks, P.C.

(57) ABSTRACT

A plasma diagnosis device and a method for manufacturing the plasma diagnosis device are provided. The plasma diagnosis device includes: a process chamber in which processes using plasma are performed; a probe structure which includes a protective layer having a first face abutting the plasma, a second face opposite to the first face, and an outer wall connecting the first face and the second face inside the process chamber, and a conductive measuring unit spaced apart from the first face of the protective layer and configured to measure a status of the plasma; and a wafer on a periphery of the probe structure and in contact with the outer wall of the protective layer, in which the wafer and the protective layer include materials different from each other.

20 Claims, 24 Drawing Sheets

(56) References Cited

U.S. PATENT DOCUMENTS

| | | | | |
|---|---|---|---|---|
| 8,889,021 | B2 | 11/2014 | Jensen et al. | |
| 9,017,513 | B2 * | 4/2015 | Gosselin | H01J 37/32935 118/712 |
| 9,754,770 | B2 | 9/2017 | Jeon et al. | |
| 12,315,710 | B2 * | 5/2025 | Kwon | H01J 37/32 |
| 2006/0171848 | A1 | 8/2006 | Roche et al. | |
| 2009/0058424 | A1 * | 3/2009 | Tatsumi | H01J 37/32935 324/464 |
| 2018/0114681 | A1 * | 4/2018 | Jensen | H01J 37/32954 |

* cited by examiner

PLASMA DIAGNOSIS DEVICE AND MANUFACTURING METHOD OF PLASMA DIAGNOSIS DEVICE

CROSS-REFERENCE TO RELATED APPLICATION

This application claims priority from Korean Patent Application No. 10-2023-0101373 filed on Aug. 3, 2023 in the Korean Intellectual Property Office, and all the benefits accruing therefrom under 35 U.S.C. 119, the contents of which in its entirety are herein incorporated by reference.

BACKGROUND

The present invention relates to a plasma diagnosis device and a method for manufacturing the plasma diagnosis device.

Plasma is an ionized gas, is made up of cations, anions, electrons, excited atoms, molecules, radicals that have chemically very strong activity, and the like, and may have electrical and thermal properties that differ from those of general gases. Such plasma may be widely used in semiconductor processes such as cleaning, etching or depositing a target.

As semiconductor elements are miniaturized and highly integrated, plasma parameters such as density of plasma or electron temperature may play an important role in semiconductor process results. Therefore, there is an increasing need to accurately measure parameters related to a status of plasma.

SUMMARY

In some embodiments of the present inventive concept, a probe may be inserted into the chamber and parameters related to the status of the plasma may be measured on the basis of the current flowing through it, and a technique of analyzing harmonic waves flowing in the probe near a floating potential is utilized as an example. Aspects of the present invention provide a plasma diagnosis device capable of accurately measuring and diagnosing parameters relating to the status of plasma.

Aspects of the present invention also provide a method for manufacturing a plasma diagnosis device capable of accurately measuring and diagnosing parameters relating to the status of plasma.

However, aspects of the present invention are not restricted to the one set forth herein. The above and other aspects of the present invention will become more apparent to one of ordinary skill in the art to which the present invention pertains by referencing the detailed description of the present invention given below.

A plasma diagnosis device according to some embodiments for achieving the above technical object includes a process chamber in which processes using plasma are performed; a probe structure which includes a protective layer that has a first face abutting the plasma, a second face opposite to the first face, and an outer wall for connecting the first face and the second face inside the process chamber, and a conductive measuring unit that is spaced apart from the first face of the protective layer and measures a status of the plasma; and a wafer which is disposed on a periphery of the probe structure in contact with the outer wall of the protective layer, in which the wafer and the protective layer include a material different from each other.

A plasma diagnosis device according to some embodiments for achieving the technical object includes a process chamber in which processes using plasma are performed; a probe structure which includes a silicon oxide layer which is disposed inside the process chamber and has a first face abutting the plasma and a second face opposite to the first face, and a measuring unit which is spaced apart from the first face of the silicon oxide layer and measures status of the plasma; an alternating current power supply unit which applies a signal to the probe structure; and a silicon (Si) wafer which is disposed on a periphery of the probe structure and in contact with side walls of the silicon oxide layer, in which the measuring unit includes a first measuring unit to which a first signal is applied from the alternating current power supply unit, and a second measuring unit to which a second signal different from the first signal is applied from the alternating current power supply unit.

A plasma diagnosis device according to some embodiments for achieving the above technical object includes an alternating current power supply unit which provides an electrical signal; a probe structure which includes a protective layer exposed to plasma, and a measuring unit that is disposed on one face of the protective layer so as not to be exposed to the plasma and transmits the electric signal supplied from the alternating current power supply unit to the plasma; a silicon (Si) wafer which is bonded to side walls of the protective layer, and has the same thickness as the protective layer; a current measuring unit which measures the current flowing through the measuring unit on the basis of a potential difference between the plasma and the measuring unit; and a plasma analysis unit which analyzes parameters relating to a status of the plasma on the basis of the current measured by the current measuring unit.

Specific matters of other embodiments are included in the detailed description and accompanying drawings.

BRIEF DESCRIPTION OF THE DRAWINGS

The above and other aspects and features of the present invention will become more apparent by describing in detail exemplary embodiments thereof with reference to the attached drawings, wherein like reference numerals (when used) indicate corresponding elements throughout the several views, and in which.

DETAILED DESCRIPTION

Although ordinal terms such as first and second may be used to describe various elements or components in the present specification, it goes without saying that these elements or components are not limited by these terms. These terms are only used to distinguish a single element or component from other elements or components and should not be interpreted as conveying any particular order of the elements with respect to one another. Therefore, it goes without saying that a first element or component referred to below may be termed a second element or component, and similarly a second element could be termed a first element, without departing from the scope or technical idea of the present disclosure.

Hereinafter, a plasma diagnosis device according to some embodiments will be described with reference to FIGS. 1 to 4.

Figure 1:
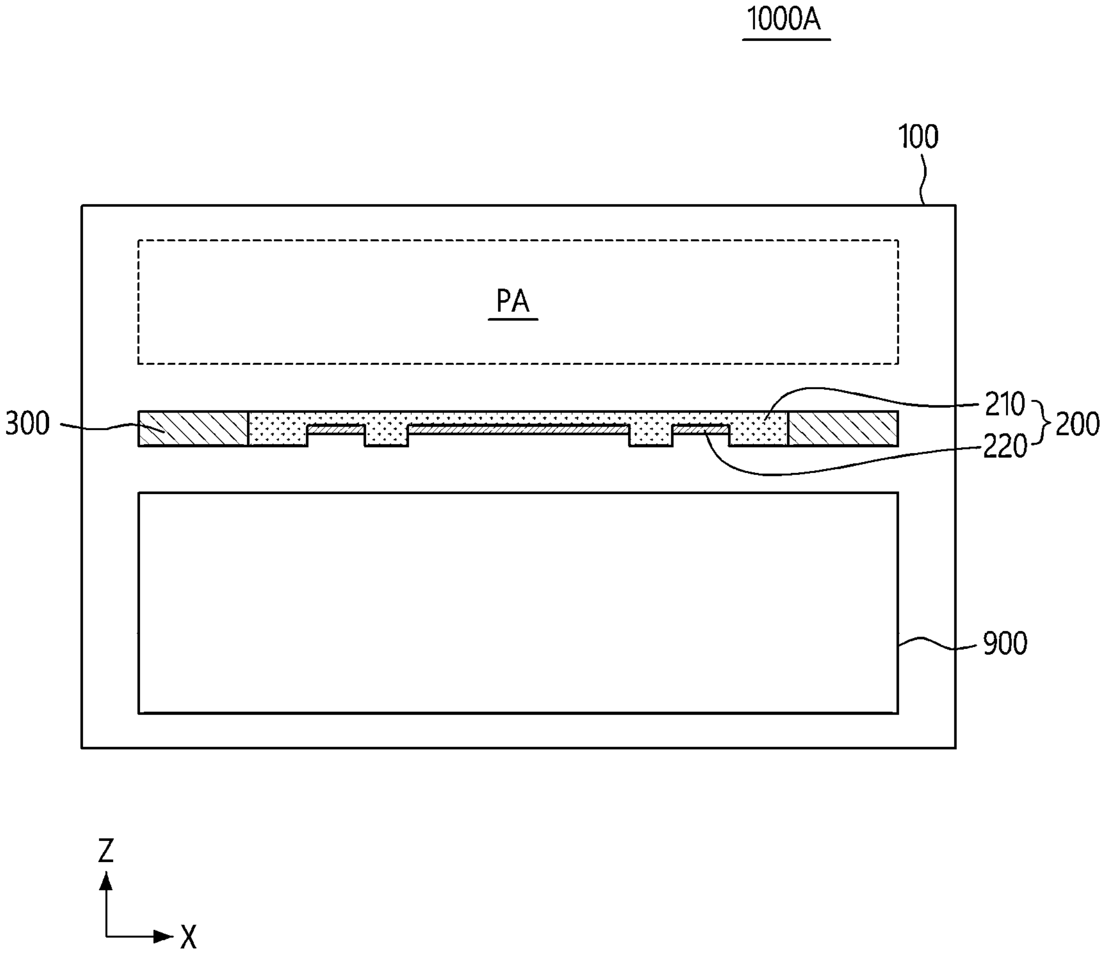
FIG. 1 is an exemplary side diagram conceptually describing a plasma diagnosis device, according to some embodiments.
Figure 2:
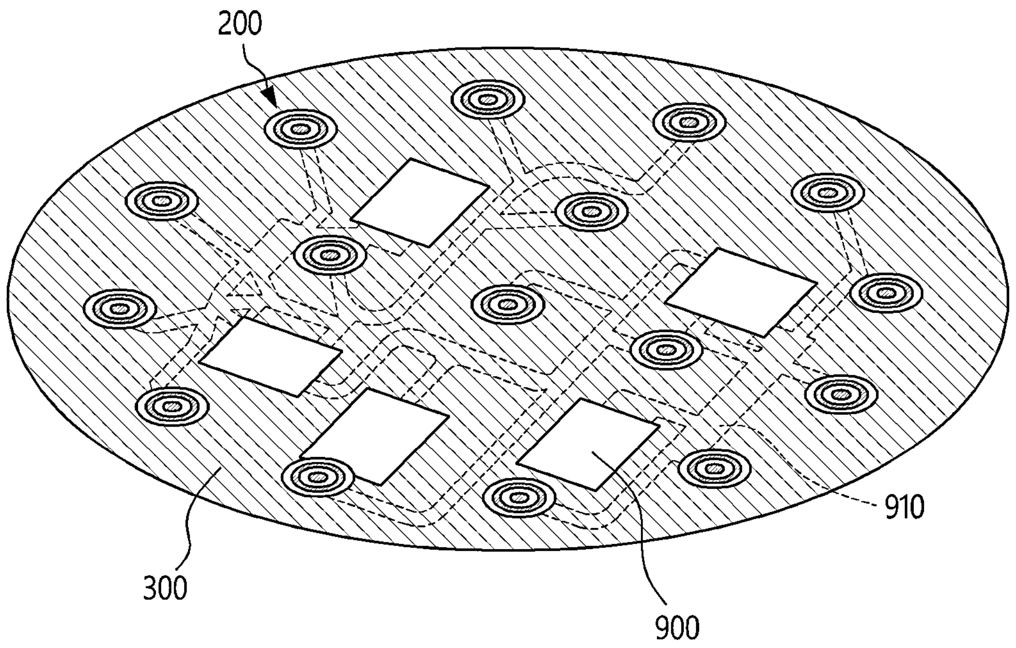
FIG. 2 is a perspective schematic diagram conceptually describing a positional relationship of a circuit unit, according to some embodiments.
Figure 3:
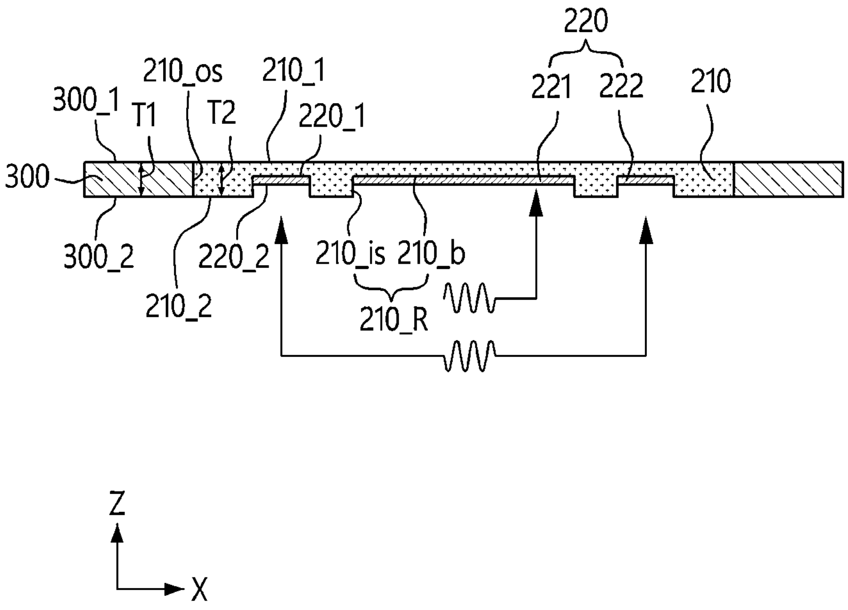
FIG. 3 is a cross-sectional diagram for explaining an example probe structure, according to some embodiments.
Figure 4:
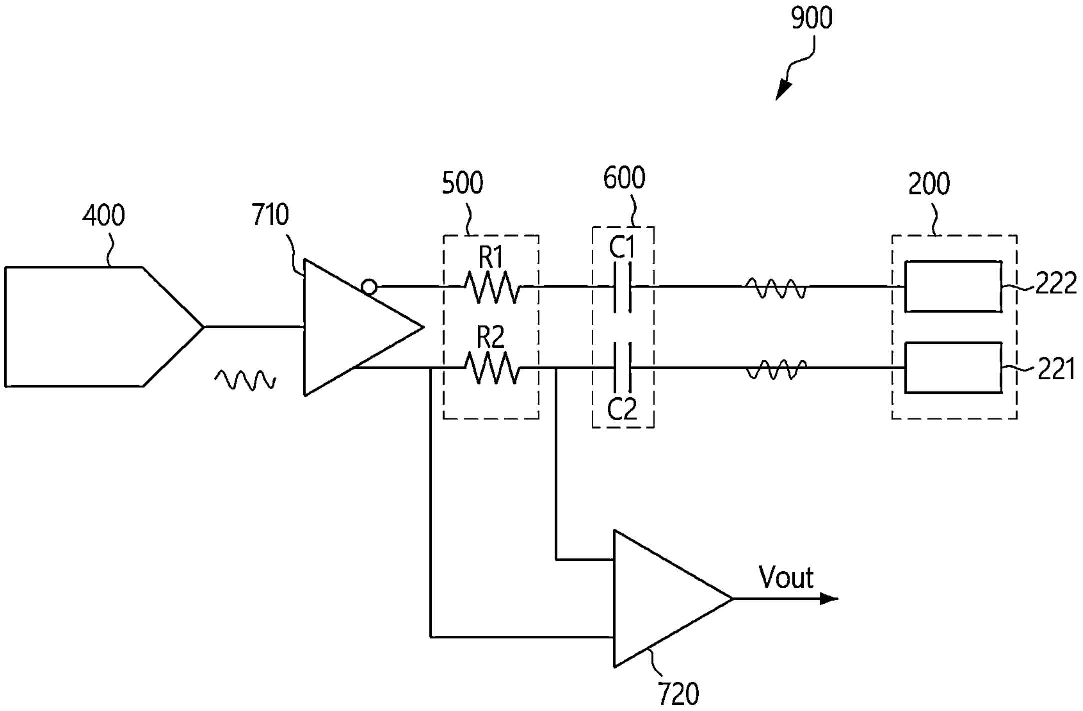
FIG. 4 is a diagram for explaining an example circuit unit, according to some embodiments.

FIG. 1 is an exemplary side diagram for explaining a plasma diagnosis device according to some embodiments. FIG. 2 is a perspective schematic diagram for explaining a positional relationship of an example circuit unit according to some embodiments. FIG. 3 is a side diagram for explaining an example probe structure according to some embodiments. FIG. 4 is a schematic diagram for explaining the example circuit unit according to some embodiments.

In some embodiments, first and second directions X and Y, respectively, may refer to directions that are parallel to a first face 300_1 of a wafer 300 and intersect each other. A third direction Z may refer to a direction perpendicular to each of the first and second directions X and Y.

Referring to FIG. 1, a plasma diagnosis device 1000A according to some embodiments may include a process chamber 100, a probe structure 200, a wafer 300, and a circuit unit 900.

Referring to FIG. 2, the circuit unit 900 of the plasma diagnosis device according to some embodiments may be placed inside the process chamber 100. In this case, an alternating current power supply unit 400, a current measuring unit 500, a direct current blocking capacitor 600, a first amplifier 710 and a second amplifier 720, which will be described later, may be disposed inside the process chamber 100. The circuit unit 900 may be electrically connected to the probe structure 200 to be described below through at least one connection wiring 910.

Referring to FIG. 3, the probe structure 200 may include a protective layer 210 and at least one measuring unit 220 disposed inside the process chamber 100. In some embodiments, the measuring unit 200 may include first and second measuring units 221 and 222, respectively, although embodiments are not limited to any specific number of measuring units 200 included in the probe structure 200. A plurality of probe structures 200 may be spaced apart from each other inside the process chamber 100.

The protective layer 210 may have a first face 210_1, a second face 210_2 opposite to the first face, and an outer wall 210_*os* that connects the first face and the second face. The first face 210_1 of the protective layer 210 may abut a plasma region PA in which plasma is generated. Therefore, the first face 210_1 of the protective layer 210 may be at least partially exposed to the plasma; that is, the first face 210_1 of the protective layer 210 may be configured to be exposed to a plasma established within the process chamber 100 during a plasma process.

The measuring unit 220 may have a first face 220_1, and a second face 220_2 opposite to the first face 220_1. The measuring unit 220 may be spaced apart from the first face 210_1 of the protective layer 210 in the third direction Z.

An alternating current generated in the alternating current power supply unit 400, which will be described later, passes through the protective layer 210, and may be applied to the measuring unit 220. Accordingly, the measuring unit 220 may measure the status of plasma.

The wafer 300 may be placed on the periphery of the probe structure 200 to be in contact with the outer wall 210_*os* of the protective layer 210. The wafer 300 may be in contact with the outer wall 210_*os* of the protective layer 210 to surround the probe structure 200. The term "contact" (or "contacting," "connect," "connecting," or like terms), as may be used herein, is intended to refer to a physical and/or electrical connection between two or more elements, and may include other intervening elements. As used herein, the term "and/or" includes any and all combinations of one or more of the associated listed items. The term "surround" (or "surrounding" or like terms), as may be used herein, is intended to broadly refer to an element, structure or layer that extends around, envelops, encircles, or encloses another element, structure or layer on all sides, although breaks or gaps may also be present.

The wafer 300 may have a first face 300_1 that abuts the plasma, and a second face 300_2 opposite to the first face 300_1. The first face 300_1 of the wafer may be disposed at substantially the same height as the first face 210_1 of the protective layer 210 on the basis of the third direction Z; that is, the first face 300_1 of the wafer may be coplanar with the first face 210_1 of the protective layer 210 in the third direction Z. In addition, the second face 300_2 of the wafer 300 may be disposed at substantially the same height as the second face 210_2 of the protective layer on the basis of in the third direction Z. That is, the wafer 300 may not be disposed below the protective layer 210 on the basis of the third direction Z.

In this case, a cross-sectional thickness T1 of the wafer 300 in the third direction Z may be substantially the same as a cross-sectional thickness T2 of the protective layer 210 in the third direction Z. For example, the thickness T2 of the protective layer 210 may, but is not limited to, a range from several micrometers (μm) to several hundred μm, more specifically from about several μm to about 775 μm.

The protective layer 210 may have a recess 210_R that has an inner wall 210_*is* extending from the second face 210_2 toward the first face 210_1 in the third direction Z, and a bottom face 210_*b* connected to the inner wall 210_*is*. In this case, one or more measuring units 220 may be placed on the bottom face of the recess 210_R to be spaced apart.

For example, the wafer 300 may be a silicon wafer including silicon (Si). As another example, the wafer may include germanium (Ge) or may include compound semiconductors such as SiC (silicon carbide), GaAs (gallium arsenide), InAs (indium arsenide), and InP (indium phosphide). According to some embodiments, the wafer may have an SOI (Silicon On Insulator) structure. The wafer may include a buried oxide layer. According to some embodiments, the wafer may include a conductive region, for example, a well doped with impurities. According to some embodiments, the wafer may have various element isolation structures such as shallow trench isolation (STI) structures that separate the doped wells from each other.

The protective layer 210 may use a material that can be subjected to a reflow process, to be described later, and that does not cause contamination problems in the process chamber 100. For example, the protective layer 210 may include at least one of glass, quartz, and ceramic. In some embodiments, the protective layer 210 may be a transparent material.

As used herein, glass may mean impurity-containing silicon oxide ($SiO_2$), and quartz may mean high-purity silicon oxide ($SiO_2$).

Although not specifically shown, the protective layer 210 may be coated with a coating layer (not shown). The coating layer may include, but is not limited to, ceramic materials such as yttria (i.e., yttrium oxide). The coating layer may protect the protective layer 210 from the plasma. In addition, the coating layer may prevent the protective layer 210 from being damaged due to an etching rate difference between the protective layer 210 and the wafer 300.

That is, in some embodiments, the wafer 300 and the protective layer 210 may include different materials from each other.

The measuring unit 220 may include a conductive material. For example, the measuring unit 220 may include a metallic material or carbon (C). For example, the measuring unit 220 may be formed on the protective layer 210 by deposition or plating. As another example, the measuring unit 220 may be physically processed, and formed by fitting the processed shape into the protective layer 210.

According to some embodiments, by forming the measuring unit 220 to include a low-resistance metallic material, linear V-I characteristics may be maintained to minimize measurement deviation. In addition, by protecting the measuring unit 220 from direct exposure to plasma by using the protective layer 210, contamination due to by-products inside the process chamber 100 may be minimized.

Referring to FIG. 4, the circuit unit 900 may include an alternating current power supply unit 400, a current measuring unit 500, a direct current blocking capacitor 600, a first amplifier 710 and a second amplifier 720. In addition, although not specifically shown, the plasma diagnosis device 1000A according to some embodiments may further include a plasma analysis unit and a display unit.

The alternating current power supply unit 400 may apply a sinusoidal voltage signal to the measuring unit 220. Although the form and magnitude of the voltage applied to the first measuring unit 221 and the second measuring unit 222 by the alternating current power supply unit 400 may be set differently depending on the plasma generation environment, voltage of the sinusoidal form generated by the alternating current voltage may be applied.

The first amplifier 710 may amplify an input sinusoidal signal and output an RF signal required for transmission.

The current measuring unit 500 may measure the current flowing through the measuring unit 220 on the basis of the electron or ion current due to the potential difference between the plasma and the measuring unit 220. The current measuring unit 500 may include first and second current detection resistors R1 and R2 connected in series to each of one end of the second and first measuring units 222 and 221, respectively.

The second current detection resistor R2 having a predetermined resistance value is connected in series to one end of the first measuring unit 221, and a potential difference between the plasma and the first measuring unit 221 may be generated at both ends of the second current detection resistor R2. When measuring this potential difference using the second amplifier 720, the magnitude of the current flowing through the first measuring unit 221 may be known.

At this time, even if the magnitude of the current flowing through the first measuring unit 221 is small, the magnitude of the current flowing through the first measuring unit 221 may be measured accurately, by selecting the second amplifier 720 having an appropriate magnitude of resistance and bandwidth.

The direct current blocking capacitor 600 may include first and second direct current blocking capacitors C1 and C2, respectively, that are coupled at one end of the probe structure 200 to block the direct current. However, the position of the direct current blocking capacitor is not limited to that shown in the drawings.

The current measured by the current measuring unit 500 is converted into a voltage Vout and is output by the second amplifier 720. The output voltage Vout may be measured separately by the vibration frequency of the measuring unit and the vibration frequency of the harmonic components.

Although not specifically shown, the plasma analysis unit may analyze parameters related to the plasma status on the basis of the I-V characteristic curve of the current measured by the current measuring unit 500 and the applied voltage. Parameters relating to the status of the plasma may relate to, for example, but not limited to, an electron temperature, a plasma density, and an ion flux.

Also, although it is not specifically shown, a display unit may display results analyzed by the plasma analysis unit. For example, the display unit may convert an electrical signal into an optical signal and display parameters relating to the status of the plasma in a graph or the like.

The plasma diagnosis device 1000A according to some embodiments may be used in combination with a device and system for optically measuring the status of plasma (OES: Optical Emission Spectrometry). For example, plasma light may be photographed by an imaging device such as a camera, and the reflected wavelength may be measured and analyzed, using the plasma diagnosis device 1000A. Accordingly, dispersion and/or material of plasma may be more accurately measured and diagnosed.

In addition, the plasma diagnosis device 1000A according to some embodiments may be used in combination with not only a process of etching a target, but also an extreme ultraviolet light source (EUV source) facility or deposition facility that exposes using extreme ultraviolet light. In addition, the plasma diagnosis device 1000A according to some embodiments may be applied to a probe structure for measuring plasma DC bias to measure plasma voltage more accurately. Furthermore, it may also be used for electrostatic chuck chucking (ESC chucking) voltage issues for properly making close-contact with and processing the wafer.

Referring to FIGS. 3 and 4 together, there may be two or more signals applied to the plasma to measure parameters related to the status of the plasma. In this case, an electrical signal may be applied from the alternating current power supply unit 400 to the measuring unit 220, using a differential signal method.

Specifically, the measuring unit 220 includes a first measuring unit 221 to which a first sinusoidal voltage signal is applied from the alternating current power supply unit 400, and a second measuring unit 222 to which a second sinusoidal voltage signal is applied from the alternating current power supply unit 400. The first sinusoidal voltage signal and the second sinusoidal voltage signal may be opposite to each other in phase. A signal difference between the first sinusoidal voltage signal and the second sinusoidal voltage signal may be measured by the current measuring unit 500.

Figure 5:
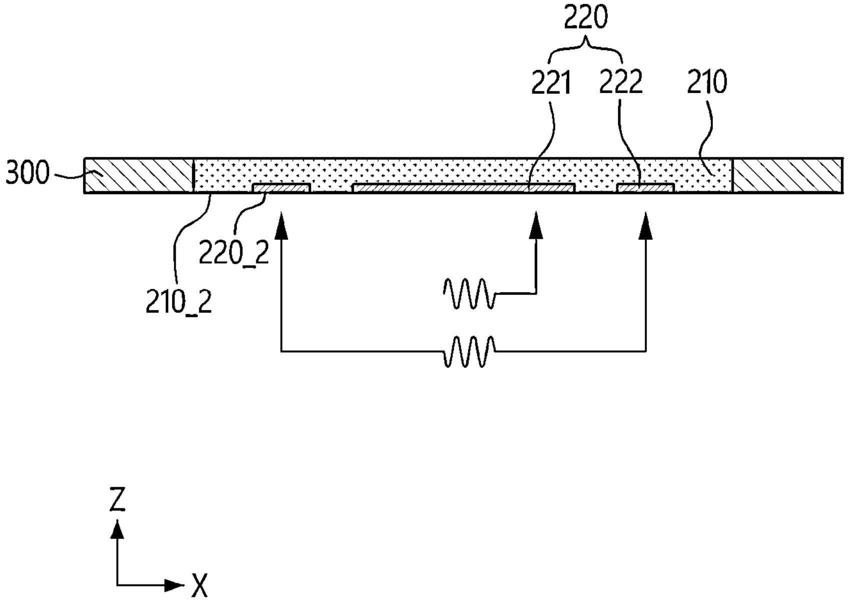
FIGS. 5 and 6 are cross-sectional diagrams for explaining an example probe structure, according to some embodiments.
Figure 6:
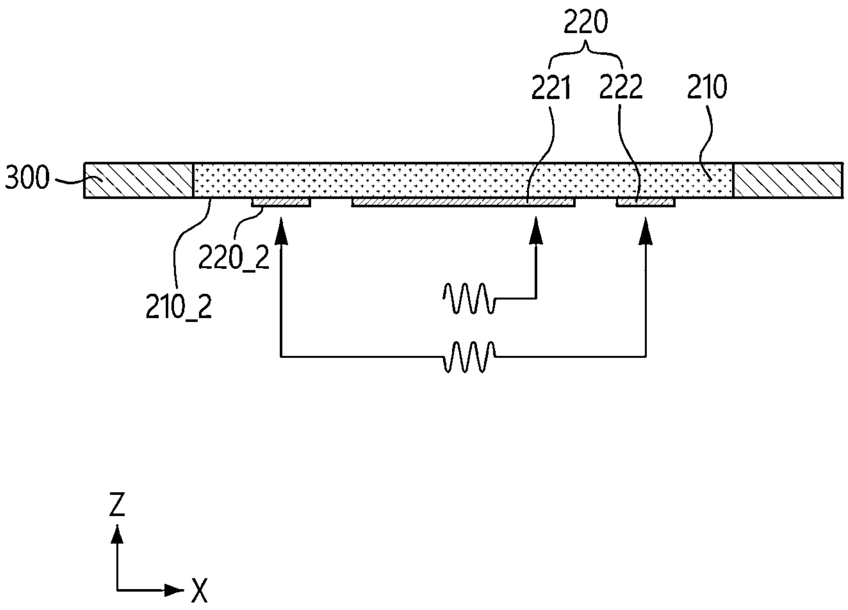

FIGS. 5 and 6 are diagrams for conceptually describing a probe structure according to some embodiments. For convenience of explanation, repeated parts of contents explained above with reference to FIGS. 1 to 4 will be briefly explained or omitted.

Referring to FIG. 5, the second face 220_2 of the measuring unit 220 may be on the same plane as (i.e., coplanar with) the second face 210_2 of the protective layer 210.

Referring to FIG. 6, the second face 220_2 of the measuring unit 220 may be placed to protrude (i.e., extend) from the second face 210_2 of the protective layer 210 in the third direction Z; that is, in some embodiments the second face 220_2 of the measuring unit 220 may not be coplanar with the second face 210_2 of the protective layer 210.

Figure 7:
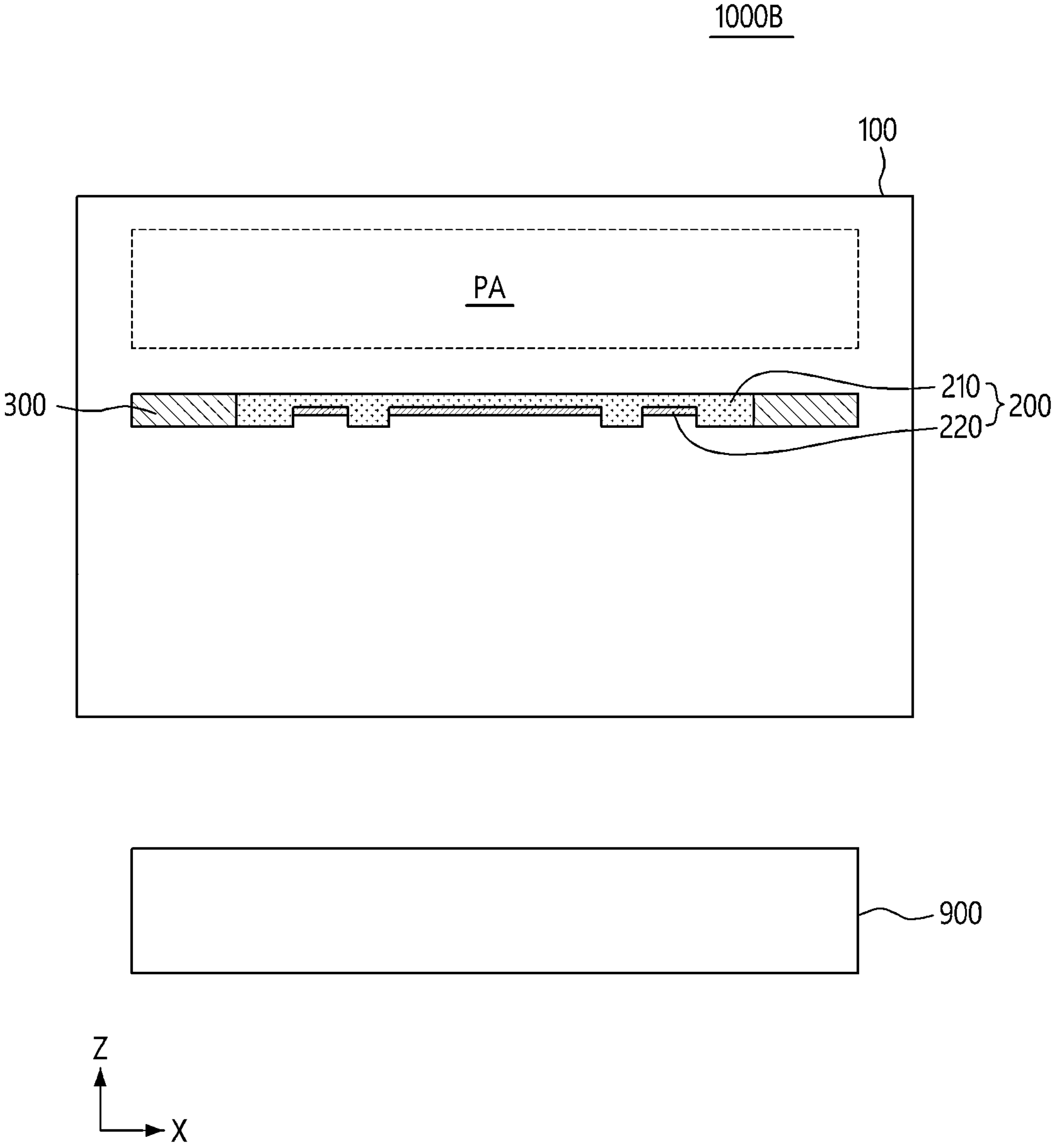
FIG. 7 is an exemplary side view diagram for explaining the plasma diagnosis device, according to some embodiments.
Figure 8:
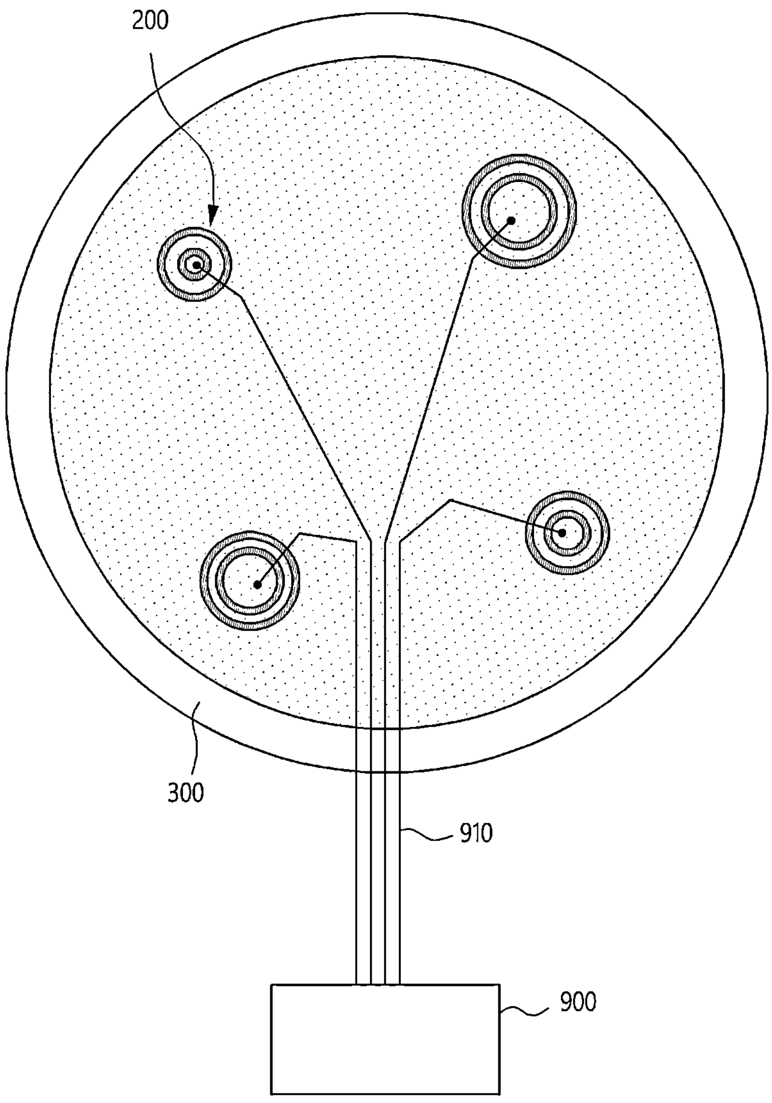
FIG. 8 is a plan view schematic diagram for explaining a positional relationship of the example circuit unit, according to some embodiments.

FIG. 7 is an exemplary side or cross-sectional view diagram for conceptually describing a plasma diagnosis device 1000B, according to some embodiments. FIG. 8 is a schematic plan view diagram for explaining a positional relationship of a circuit unit according to some embodiments. For convenience of explanation, repeated parts of contents explained above with reference to FIGS. 1 to 4 will be briefly explained or omitted.

Referring to FIGS. 7 and 8, the circuit unit 900 of a plasma diagnosis device 1000B according to some embodiments may be disposed outside the process chamber 100. In this case, the alternating current power supply unit 400, the current measuring unit 500, the direct current blocking capacitor 600, the first amplifier 710 and the second amplifier 720 (see FIG. 4) may be disposed outside the process chamber 100. The circuit unit 900 disposed outside the process chamber 100 may be electrically connected to the probe structure 200 through at least one connection wiring 910.

Figure 9:
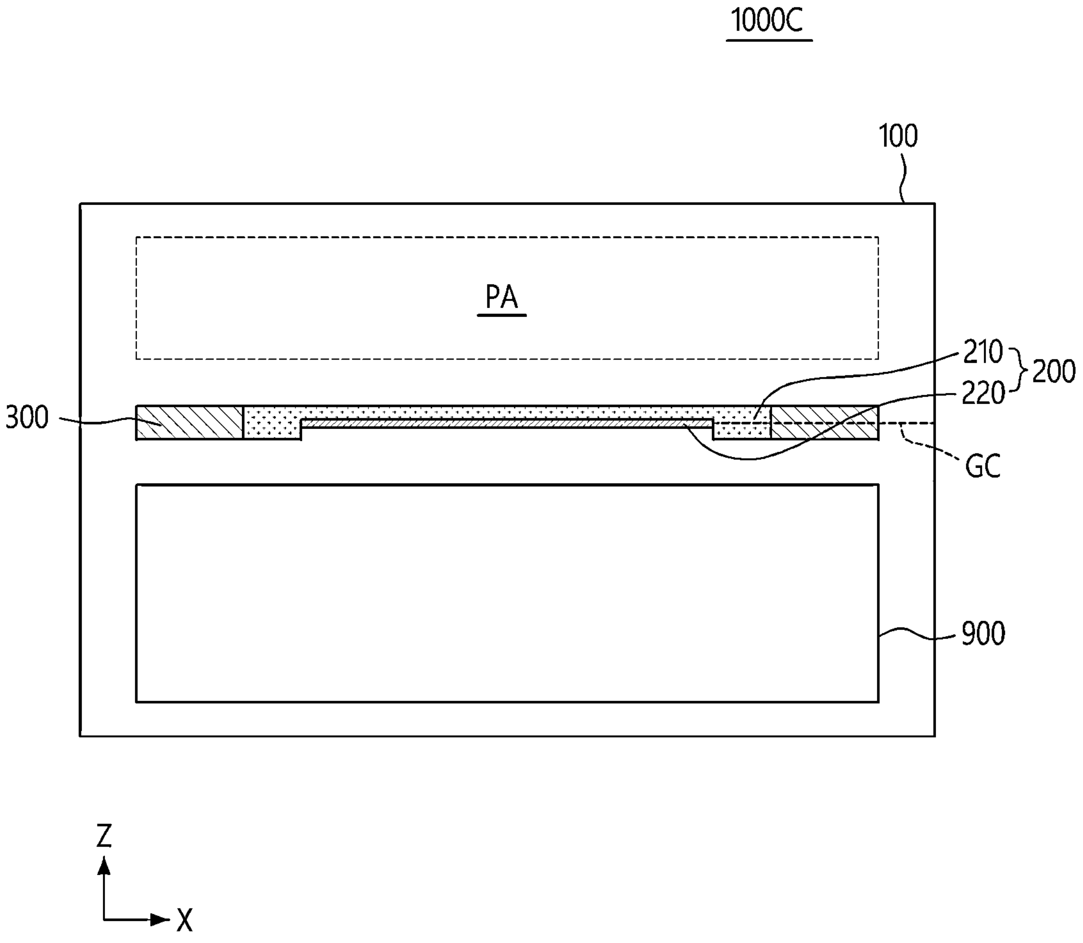
FIG. 9 is an exemplary side view diagram for explaining the plasma diagnosis device, according to some embodiments.
Figure 10:
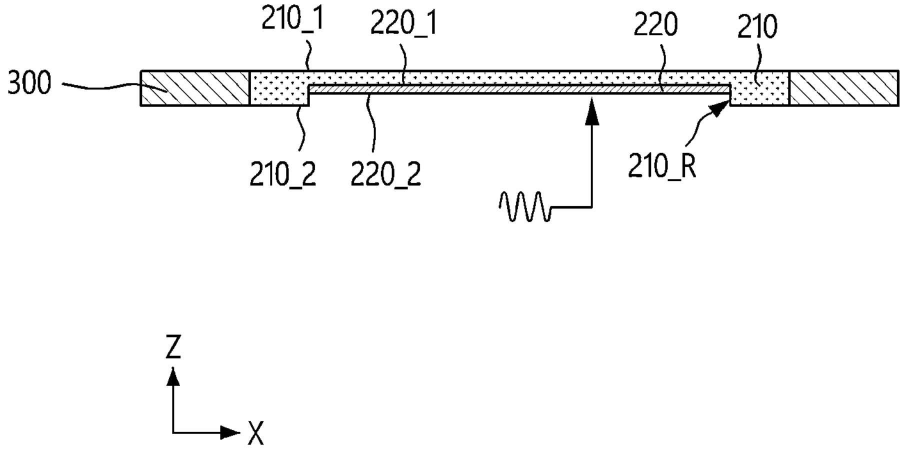
FIGS. 10 to 12 are side view diagrams for explaining the example probe structure, according to some embodiments.
Figure 11:
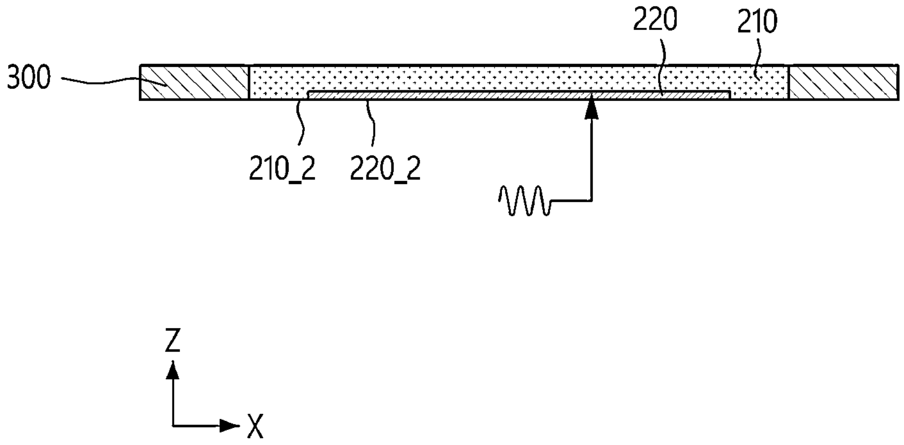
Figure 12:
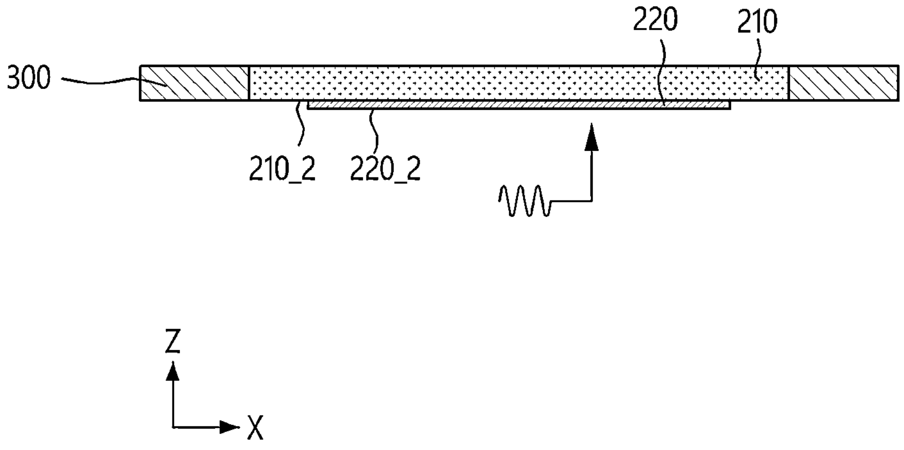

FIG. 9 is an exemplary side view diagram for explaining a plasma diagnosis device 1000C, according to some embodiments. FIGS. 10 to 12 are side view diagrams for explaining an example probe structure according to some embodiments. For convenience of explanation, repeated parts of contents explained above with reference to FIGS. 1 to 8 will be briefly explained or omitted.

Referring to FIG. 9, an electrical signal may be applied from the alternating current power supply unit 400 (FIG. 4) to the measuring unit 220 using a single-ended method. Specifically, the first signal may be applied to measuring unit 220 from the alternating current power supply unit 400. The current measuring unit 500 may measure the signal difference between the first signal and a reference signal. As used herein, the reference signal may mean a signal connected to the ground through a ground connection wiring GC adjacent to the side wall of the process chamber 100.

Referring to FIG. 10, the protective layer 210 may include a recess 210_R which has opposing inner walls extending in the third direction Z at least partially through the protective layer 210 from the second face 210_2 toward the first face 210_1, and a bottom face connected to the inner walls and extending in the first direction X. In this case, the measuring unit 220 may be disposed on the bottom face of the recess 210_R.

FIGS. 11 and 12 are side view diagrams depicting an example probe structure, according to some embodiments. For convenience of explanation, repeated parts of contents explained above with reference to FIGS. 1 to 10 will be briefly explained or omitted.

Referring to FIG. 11, the second face 220_2 of the measuring unit 220 may be placed on the same plane as (i.e., coplanar with) the second face 210_2 of the protective layer 210 in the third direction Z.

Referring to FIG. 12, the second face 220_2 of the measuring unit 220 may be placed to protrude from the second face 210_2 of the protective layer 210 in the third direction Z, such that the second face 220_2 of the measuring unit 220 is not coplanar with the second face 210_2 of the protective layer 210 in the third direction Z.

By way of example only and without limitation, FIGS. 13 to 18 are plan view diagrams depicting illustrative shapes of a probe structure 200, according to some embodiments. For convenience of explanation, repeated parts of contents explained above with reference to FIGS. 1 to 12 will be briefly explained or omitted.

Figure 13:
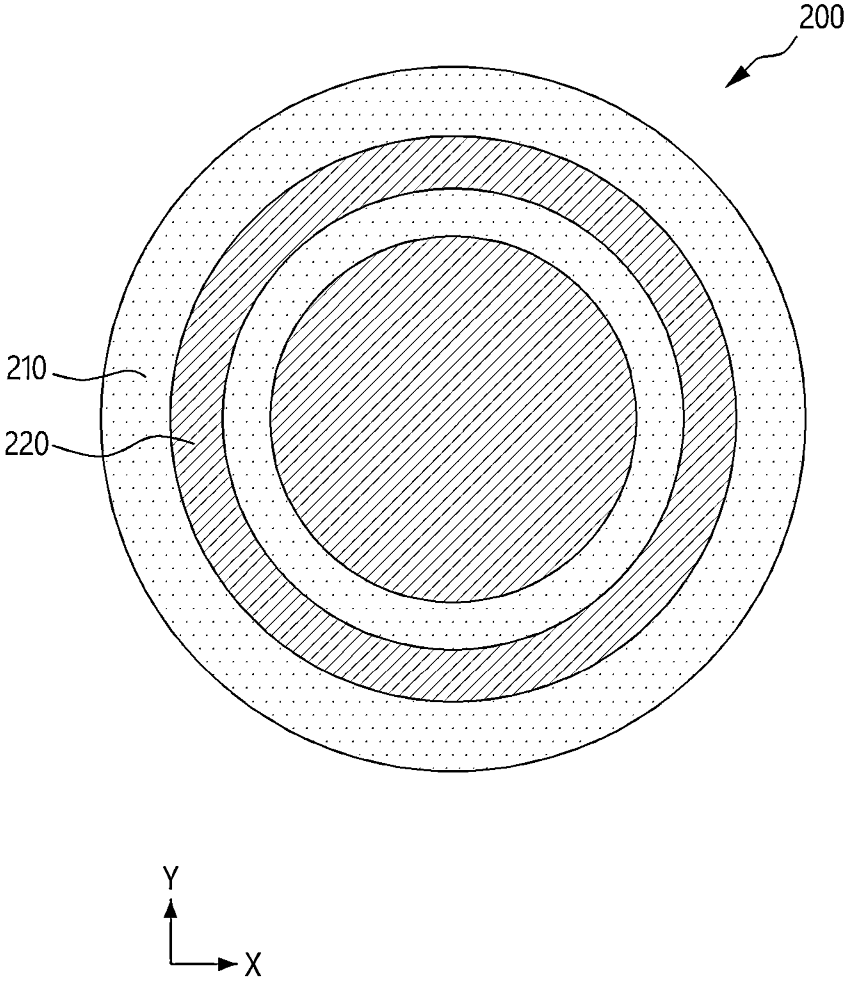
FIGS. 13 to 18 are diagrams for explaining a shape of the probe structure according to some embodiments.

Referring to FIG. 13, the probe structure 200 includes a pair of concentric measuring units 220. In this case, a signal may be applied to the measuring unit 220 in a differential manner as described in connection with FIG. 3.

Figure 14:
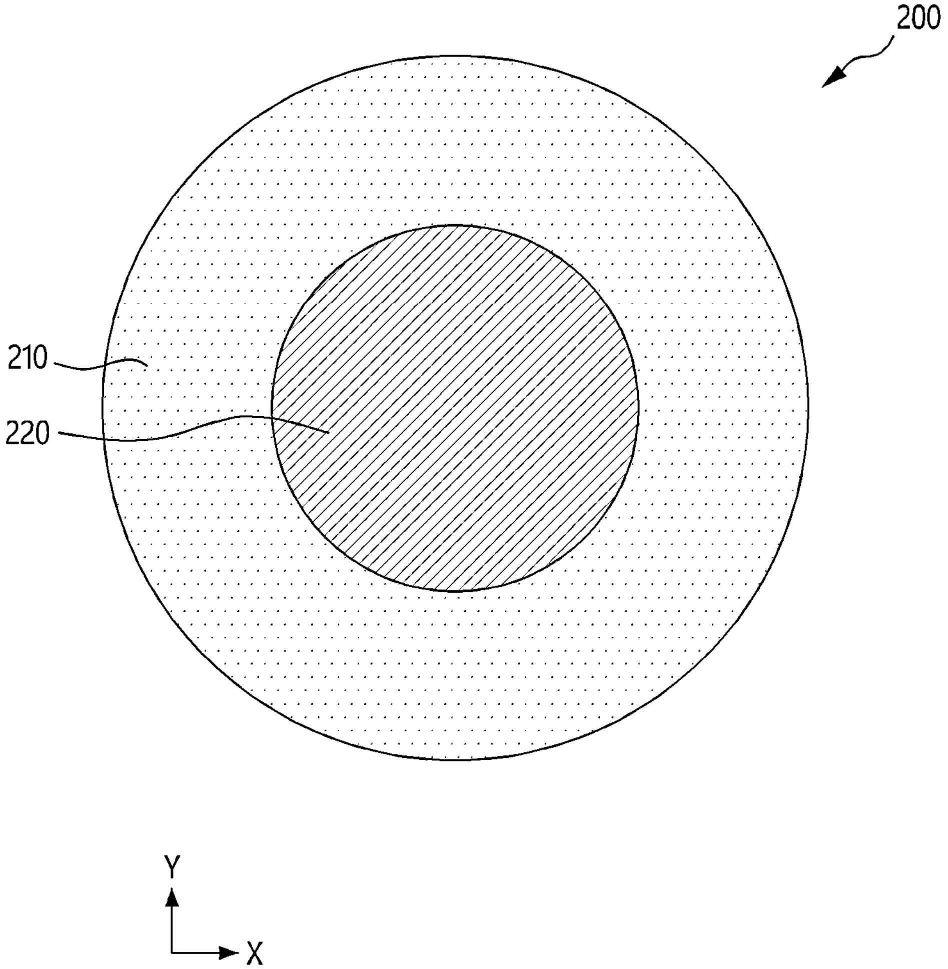

Referring to FIG. 14, the probe structure 200 includes a single circular measuring unit 220. The measuring unit 220 may have a flat plate shape. In this case, as described in conjunction with FIG. 10, a signal may be applied to the measuring unit 220 in a single-ended manner.

Figure 15:
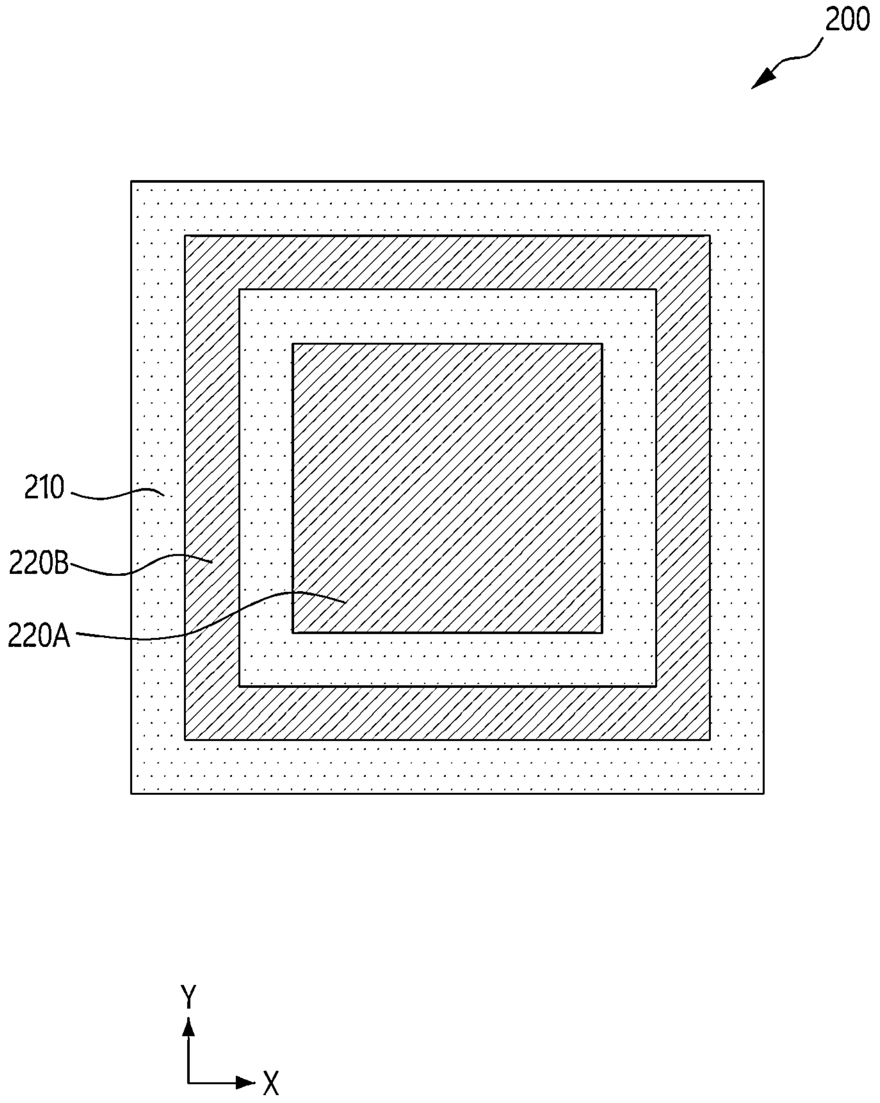

Referring to FIG. 15, the probe structure 200 includes a rectangular first_1 measuring unit 220A, and a first_2 measuring unit 220B extending around the first_1 measuring unit 220A. In this case, a signal may be applied to the first_1 measuring unit 220A and the first_2 measuring unit 220B in a differential manner as described with reference to FIG. 3.

Figure 16:
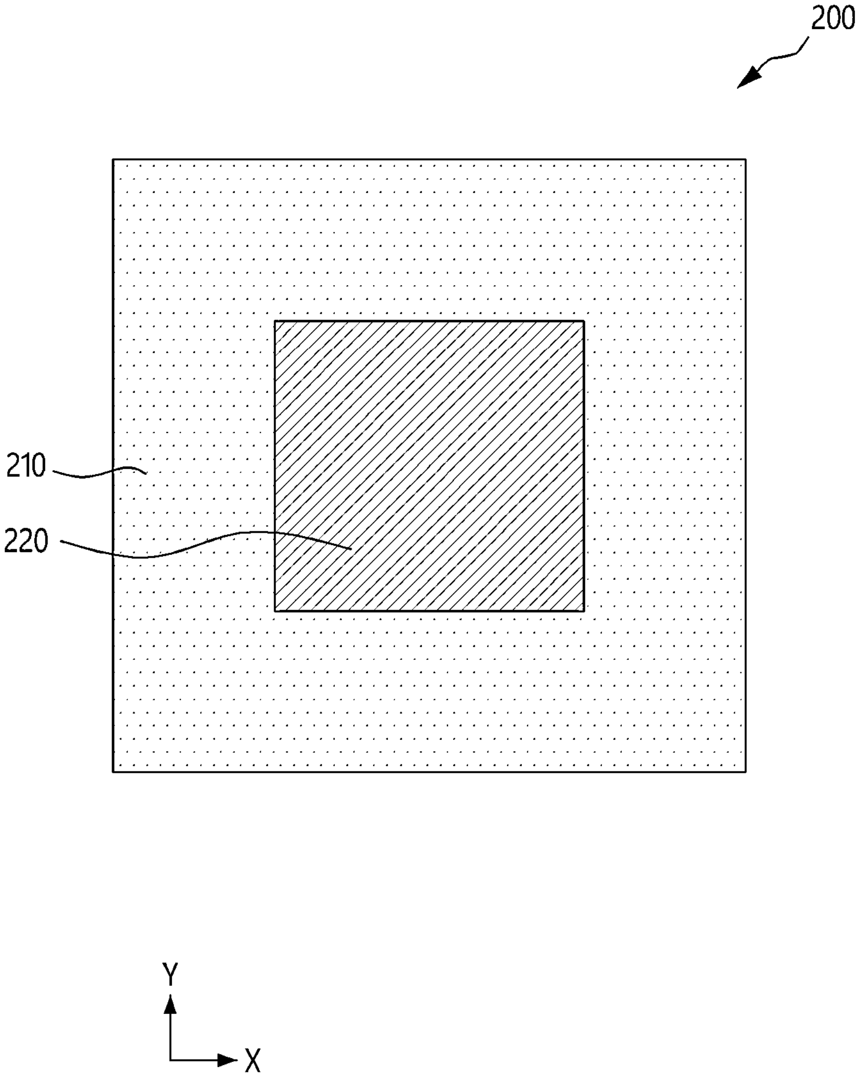

Referring to FIG. 16, the probe structure 200 includes a single rectangular measuring unit 220. In this case, as described in conjunction with FIG. 10, a signal may be applied to the measuring unit 220 in a single-ended manner.

Figure 17:
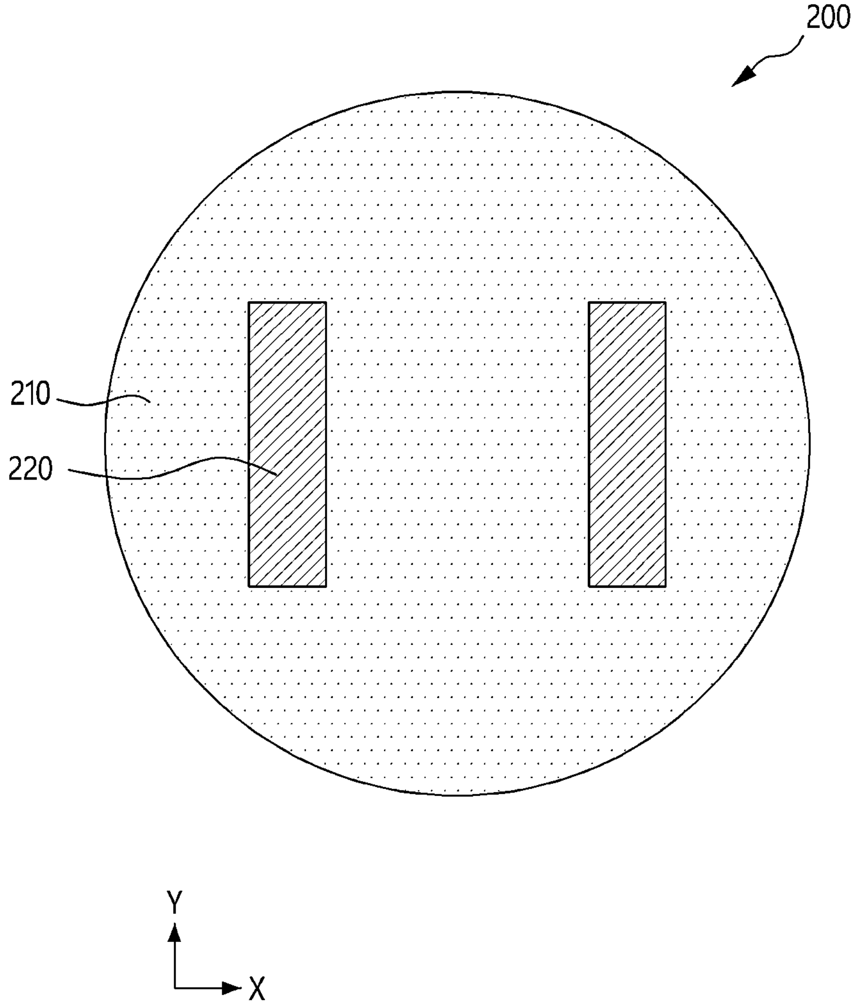

Referring to FIG. 17, the probe structure 200 includes a pair of rectangular measuring units 220 extending in the second direction Y and spaced apart from each other in the first direction X (i.e., spaced apart laterally). Alternatively, although not specifically shown, the probe structure 200 may include a pair of square measuring units 220 spaced apart laterally from each other. In this case, a signal may be applied to the measuring unit 220 in a differential manner as described in conjunction with FIG. 3.

Figure 18:
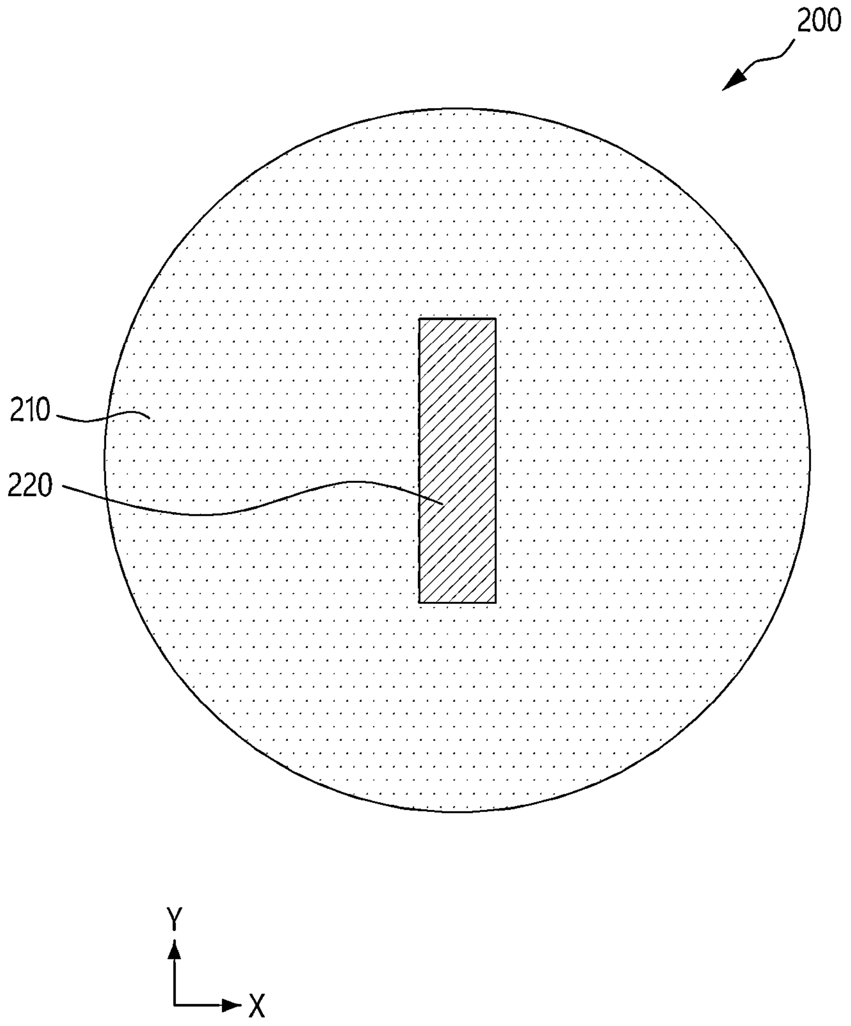

Referring to FIG. 18, the probe structure 200 includes a single rectangular measuring unit 220. Alternatively, although not specifically shown, the probe structure 200 may include a single square measuring unit 220. In this case, as described with reference to FIG. 10, a signal may be applied to the measuring unit 220 in a single-ended manner.

FIGS. 19 to 24 are side or cross-section views depicting intermediate processes in an illustrative method for manufacturing a plasma diagnosis device, according to some embodiments. For convenience of explanation, repeated parts of contents explained above in connection with FIGS. 1 to 6 will be briefly explained or omitted.

Figure 19:
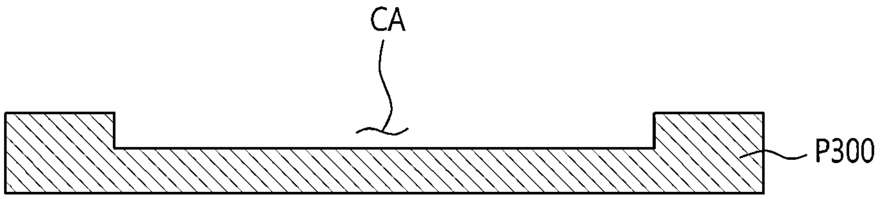
FIGS. 19 to 24 are plan view diagrams for explaining an example method for manufacturing the plasma diagnosis device, according to some embodiments.

Referring to FIG. 19, a preliminary wafer P300 may be etched to form a cavity CA inside the preliminary wafer P300. The etching of the preliminary wafer P300 may be performed using, for example, deep reactive ion etching (DRIE) or machining center (MCT) processing. For example, the preliminary wafer P300 may be a silicon (Si) wafer.

Figure 20:
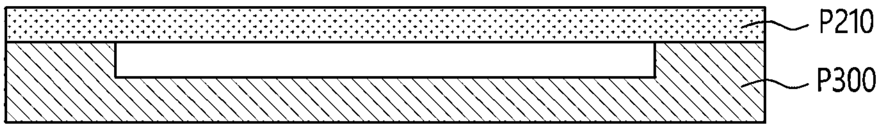

Referring to FIG. 20, one face of the preliminary wafer P300 in which the cavity CA is formed, and one face of the preliminary protective layer P210 may be joined to each other. The preliminary wafer P300 and the preliminary protective layer P210 may be bonded, using anodic bonding, although embodiments are not limited thereto. For example, the preliminary protective layer P210 may include glass or quartz. Because no gap between the glass and the silicon (Si) wafer may substantially exist according to such anodic bonding, the glass and the silicon (Si) wafer can be bonded more firmly.

Figure 21:
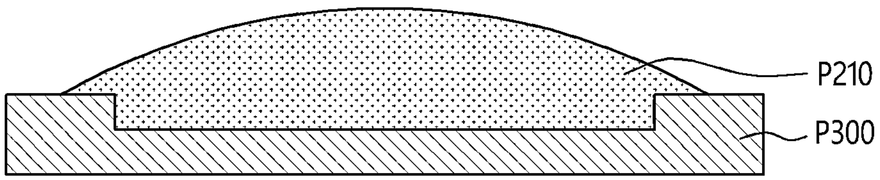

Referring to FIG. 21, the preliminary protective layer P210 may be filled inside the cavity CA by performing a glass reflow process. In the reflow process, the preliminary protective layer P210 may be formed on at least a part of one face of the preliminary wafer P300 in which the cavity CA is formed. In some embodiments, the glass reflow may refer to a process of feeding a certain amount of glass to a region to be bonded in advance and then melting the glass under high vacuum and/or high pressure conditions to fill glass the region to be bonded. The term "fill" (or "filling," "filled," or like terms), as may be used herein, is intended to refer broadly to either completely filling a defined space (e.g., the cavity CA) or partially filling the defined space; that is, the defined space need not be entirely filled but may, for example, be partially filled or have voids or other spaces throughout.

Although not specifically shown, a coating layer for additionally coating the preliminary protective layer P210 may be further formed, after the reflow process. The coating layer may include ceramic, yttria, and the like.

Figure 22:
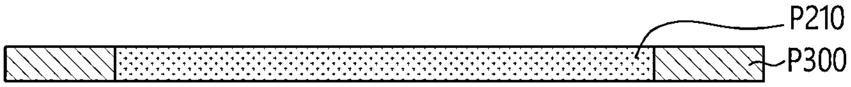

Referring to FIG. 22, a planarization process may be performed so that one face of the preliminary wafer P300 and one face of the preliminary protective layer P210 are positioned on the same plane (i.e., coplanar). The planarization process may be performed, for example, through chemical mechanical polishing (CMP), although embodiments are not limited thereto. For example, a step difference between the preliminary wafer P300 and the preliminary protective layer P210 may be, but is not limited to, within several μm.

That is, there may be substantially no step difference between the preliminary wafer P300 and the preliminary protective layer P210. Accordingly, it is possible to prevent the problem of plasma arcing that may occur due to the step difference described above. As a result, greater accuracy may be ensured compared to the related art, when measuring and/or diagnosing the plasma parameters.

Figure 23:
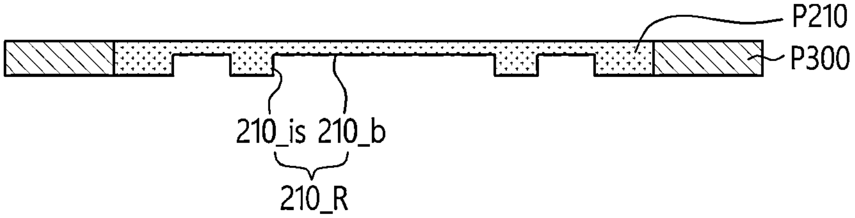

Referring to FIG. 23, a recess 210_R which has an inner wall 210_*is* and a bottom face 210_*b* for exposing the preliminary protective layer P210 may be formed on the other face opposite to one face of the preliminary protective layer P210. The term "exposing" (or "expose," or like terms) may be used to describe relationships between elements and/or with reference to intermediate processes in fabricating a plasma diagnosis device, but may not require exposure of a particular element in the completed device. Likewise, the term "not exposed" may be used to described relationships between elements and/or with reference to intermediate processes in fabricating a plasma diagnosis device, but may not require a particular element to be unexposed in the completed device. The formation of the recess 210_R may be performed using, for example, deep reactive ion etching (DRIE) or machining center (MCT) processing.

Since the preliminary protective layer P210 may include glass or quartz, it is possible to minimize by-products generated during the etching process from contaminating the inside of the process chamber.

Figure 24:
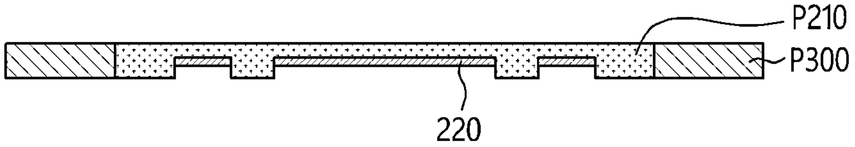

Referring to FIG. 24, the measuring unit 220 may be formed on the bottom face 210_*b* of the recess 210_R (FIG. 23). The measuring unit 220 may be formed by a deposition process or a plating process of a conductive material such as a metal material, although embodiments are not limited thereto.

Accordingly, the plasma diagnosis device 1000A including the protective layer 210 and the wafer 300 as shown in FIG. 3 may be formed.

Although the embodiments of the present invention have been described above with reference to the accompanying drawings, the present invention is not limited to the above embodiments, and may be fabricated in various forms. Those skilled in the art will appreciate that the present invention may be embodied in other specific forms without changing the technical spirit or essential features of the present invention. Accordingly, the above-described embodiments should be understood in all respects as illustrative and not restrictive.

What is claimed is:

1. A plasma diagnosis device, comprising:

a process chamber in which processes using plasma are performed;

a probe structure which includes a protective layer that has a first face configured to be exposed to a plasma established within the process chamber during a plasma process, a second face opposite to the first face, and an outer wall connecting the first face and the second face inside the process chamber, and a conductive measuring unit spaced apart from the first face of the protective layer and configured to measure a status of the plasma; and a wafer on a periphery of the probe structure and in contact with the outer wall of the protective layer, wherein the wafer and the protective layer include materials different from each other.

2. The plasma diagnosis device of claim 1, wherein a cross-sectional thickness of the wafer is the same as a cross-sectional thickness of the protective layer.

3. The plasma diagnosis device of claim 1, further comprising:

an alternating current power supply unit configured to apply a sinusoidal voltage signal to the conductive measuring unit; and a current measuring unit configured to measure a current flowing through the conductive measuring unit as a function of a potential difference between the plasma and the conductive measuring unit.

4. The plasma diagnosis device of claim 3, wherein the conductive measuring unit includes a first measuring unit to which a first signal is applied from the alternating current power supply unit, and the current measuring unit is configured to measure a signal difference between the first signal and a reference signal.

5. The plasma diagnosis device of claim 3, wherein the conductive measuring unit includes a first measuring unit to which a first signal is applied from the alternating current power supply unit, and a second measuring unit to which a second signal opposite in phase to the first signal is applied from the alternating current power supply unit, and the current measuring unit is configured to measure a signal difference between the first signal and the second signal.

6. The plasma diagnosis device of claim 3, further comprising:

a plasma analysis unit configured to analyze one or more parameters related to the status of the plasma as a function of the current measured by the current measuring unit; and a display unit that displays results analyzed by the plasma analysis unit.

7. The plasma diagnosis device of claim 1, wherein the protective layer includes a recess therein, the recess having inner walls extending in a first direction perpendicular to an upper surface of the protective layer from the second face toward the first face, and a bottom face extending in a second direction parallel to the upper surface of the protective layer and connected to the inner walls, and the conductive measuring unit is on the bottom face of the recess.

8. The plasma diagnosis device of claim 1, wherein a third face of the conductive measuring unit protrudes from the second face of the protective layer.

9. The plasma diagnosis device of claim 1, wherein a first face of the conductive measuring unit is coplanar with the second face of the protective layer in a first direction perpendicular to an upper surface of the protective layer.

10. The plasma diagnosis device of claim 1, wherein the wafer is a silicon (Si) wafer, and the protective layer includes at least one of glass, quartz, or ceramic.

11. The plasma diagnosis device of claim 1, wherein the conductive measuring unit includes a metal material.

12. A plasma diagnosis device, comprising:

a process chamber in which processes using plasma are performed;

a probe structure which includes a silicon oxide layer inside the process chamber and has a first face configured to be exposed to a plasma established within the process chamber during a plasma process and a second face opposite to the first face, and a measuring unit spaced apart from the first face of silicon oxide layer and configured to measure a status of the plasma;

an alternating current power supply unit configured to provide a signal to the probe structure; and a silicon (Si) wafer on a periphery of the probe structure and in contact with side walls of the silicon oxide layer, wherein the measuring unit of the probe structure includes a first measuring unit to which a first signal is applied from the alternating current power supply unit, and a second measuring unit to which a second signal different from the first signal is applied from the alternating current power supply unit.

13. The plasma diagnosis device of claim 12, wherein the silicon wafer has a third face abutting the plasma, and a fourth face opposite to the third face, and the third face of the silicon wafer is coplanar with the first face of the silicon oxide layer in a first direction.

14. The plasma diagnosis device of claim 12, further comprising:

a current measuring unit configured to measure a current flowing through the first and second measuring units as a function of a potential difference between the plasma and the first and second measuring units; and a plasma analysis unit configured to analyze one or more parameters related to the status of the plasma as a function of the current measured by the current measuring unit.

15. The plasma diagnosis device of claim 12, wherein the silicon oxide layer includes a recess extending in a first direction from the second face toward the first face, and the first and second measuring units are inside the recess and spaced apart from each other in the first direction.

16. The plasma diagnosis device of claim 12, further comprising:

a ceramic coating layer on the silicon oxide layer.

17. The plasma diagnosis device of claim 12, wherein each of the first and second measuring units includes a conductive material.

18. A plasma diagnosis device, comprising:

an alternating current power supply unit configured to provide an electrical signal;

a probe structure including a protective layer including a first face configured to be exposed to plasma established during a plasma process and a second face opposite the first face, and a measuring unit on the second face of the protective layer and configured to transmit the electrical signal supplied from the alternating current power supply unit to the plasma;

a silicon (Si) wafer bonded to side walls of the protective layer, and having a same cross-sectional thickness as a cross-sectional thickness of the protective layer;

a current measuring unit configured to measure a current flowing through the measuring unit of the probe structure as a function of a potential difference between the plasma and the measuring unit of the probe structure; and a plasma analysis unit configured to analyze one or more parameters relating to a status of the plasma as a function of the current measured by the current measuring unit.

19. The plasma diagnosis device of claim 18, wherein the measuring unit of the probe structure includes a first measuring unit to which a first signal is applied from the alternating current power supply unit, and the current measuring unit is configured to measure a signal difference between the first signal and a reference signal.

20. The plasma diagnosis device of claim 18, wherein the measuring unit of the probe structure includes a first measuring unit to which a first signal is applied from the alternating current power supply unit, and a second measuring unit to which a second signal is applied from the alternating current power supply unit, and phases of the first signal and the second signal are opposite to each other.

* * * * *